(12) United States Patent
Tu et al.

(10) Patent No.: US 10,978,336 B2
(45) Date of Patent: Apr. 13, 2021

(54) METHODS OF MANUFACTURING SEMICONDUCTOR DEVICES

(71) Applicant: Winbond Electronics Corp., Taichung (TW)

(72) Inventors: Cheng-Hui Tu, Taichung (TW); Chi-Ching Liu, Chiayi (TW); Ting-Ying Shen, Chiayi (TW); Yen-De Lee, Taipei (TW); Ping-Kun Wang, Tianzhong Township, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/704,152

(22) Filed: Dec. 5, 2019

(65) Prior Publication Data
US 2020/0235001 A1    Jul. 23, 2020

(30) Foreign Application Priority Data
Jan. 19, 2019  (TW) .................................. 108102111

(51) Int. Cl.
*H01L 21/768* (2006.01)

(52) U.S. Cl.
CPC ...... *H01L 21/7682* (2013.01); *H01L 21/7685* (2013.01); *H01L 21/76802* (2013.01); *H01L 21/76877* (2013.01)

(58) Field of Classification Search
CPC .......... H01L 21/7682; H01L 21/76802; H01L 21/76807; H01L 21/7685; H01L 21/76877; H01L 2221/1026
See application file for complete search history.

(56) References Cited

U.S. PATENT DOCUMENTS

| | | | |
|---|---|---|---|
| 6,214,719 B1 | 4/2001 | Nag | |
| 6,406,992 B1 | 6/2002 | Mao et al. | |
| 2002/0055256 A1 | 5/2002 | Jiang | |
| 2012/0261828 A1 | 10/2012 | Bruce et al. | |
| 2015/0311151 A1* | 10/2015 | Chi | H01L 21/7682 257/773 |
| 2018/0019202 A1* | 1/2018 | Conti | H01L 23/53295 |
| 2018/0019203 A1 | 1/2018 | Conti et al. | |
| 2019/0131346 A1* | 5/2019 | Lin | H01L 43/12 |

* cited by examiner

*Primary Examiner* — Changhyun Yi
(74) *Attorney, Agent, or Firm* — Muncy, Geissler, Olds & Lowe, P.C.

(57) ABSTRACT

A method of manufacturing a semiconductor device includes forming a first dielectric layer and a through hole passing through the first dielectric layer over a substrate; forming a plurality of dummy contacts in the through hole; forming a plurality of first dummy wires on the plurality of dummy contacts; filling a second dielectric layer between the plurality of first dummy wires, wherein the second dielectric layer has a first air gap; removing the dummy contacts and the first dummy wires to expose the through hole, thereby forming a first wiring trench over the through hole; and forming a contact and a first wire in the through hole and the first wiring trench.

19 Claims, 6 Drawing Sheets

METHODS OF MANUFACTURING SEMICONDUCTOR DEVICES

CROSS REFERENCE TO RELATED APPLICATIONS

This application claims priority of Taiwan Patent Application No. 108102111, filed on Jan. 19, 2019, the entirety of which is incorporated by reference herein.

BACKGROUND

Technical Field

The present disclosure relates to semiconductor manufacturing, and in particular it relates to methods of manufacturing semiconductor devices having interconnect structures.

Description of the Related Art

As semiconductor devices are gradually miniaturized, capacitive coupling between adjacent interconnect structures, metal lines, or other components also increases, causing problems with RC delays to become severe, thereby affecting the efficacy of the semiconductor devices. A method of solving the above problems includes forming a dielectric layer with a low-k dielectric material or forming an air gap in the dielectric layer. The dielectric constant of air is smaller than that of a low-k dielectric material, so a structure with an air gap can significantly reduce the capacitance.

However, although these methods generally meet requirements, they are still not satisfactory in every respect. Therefore, it is required to further improve the methods of manufacturing semiconductor devices to improve the yield of the semiconductor devices.

BRIEF SUMMARY

In accordance with some embodiments of the present disclosure, a method of manufacturing semiconductor devices is provided. The method includes forming a first dielectric layer and a through hole passing through the first dielectric layer over a substrate; forming a plurality of dummy contacts in the through hole; forming a plurality of first dummy wires on the plurality of dummy contacts; filling a second dielectric layer between the plurality of first dummy wires, wherein the second dielectric layer has a first air gap; removing the dummy contacts and the first dummy wires to expose the through hole, thereby forming a first wiring trench over the through hole; and forming a contact and a first wire in the through hole and the first wiring trench.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Methods of manufacturing semiconductor devices are described in accordance with some embodiments of the present disclosure. The present disclosure provides a new method for forming an air gap. By providing a dummy wire, the method can avoid damage to the wire during the process of forming the air gap without increasing the number of masks, thereby increasing the yield of semiconductor devices. The method can also easily control the position and size of the air gap to adjust the semiconductor devices to have the desired dielectric constant.

FIGS. 1A-1G are cross-sectional views illustrating various stages of manufacturing a semiconductor device 100, in accordance with some embodiments. The method of manufacturing the semiconductor device 100 of the present disclosure is suitable for forming an interconnect structure on a substrate 102. The substrate 102 is, for example, a silicon wafer, and any desired semiconductor component may be formed thereon, for example, a Metal-Oxide-Semiconductor Field Effect Transistor (MOSFET), a resistor, a logic element or the like, and the substrate 102 is illustrated as flat for simplicity. In the description of the present disclosure, the term "substrate" includes formed components on a semiconductor wafer and various coatings overlying the semiconductor wafer.

Figure 1A:
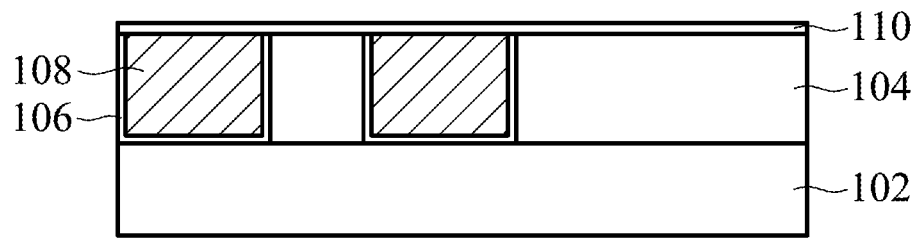
FIGS. 1A-1G are cross-sectional views illustrating various stages of manufacturing a semiconductor device in accordance with some embodiments.

As illustrated in FIG. 1A, the semiconductor device 100 includes the substrate 102. Any substrate material suitable for the semiconductor device 100 may be used.

A dielectric layer 104, a wire 108 in the dielectric layer, and a barrier layer 106 between the dielectric layer 104 and the wire 108 are then formed over the substrate 102. The dielectric layer 104 may include silicon oxide, a low-k dielectric material, or a combination thereof. The dielectric layer 104 may be formed by performing a deposition process, such as a chemical vapor deposition (CVD) process.

Then, the dielectric layer 104 may be etched to form a trench, and the barrier layer 106 may be conformally formed in the trench. The dielectric layer 104 may be etched with one or more mask layers (not shown).

Then, the barrier layer 106 may be conformally formed in the trench to prevent the wire 108 from falling out of the trench, and avoid problems such as leakage caused by material diffusion of the wire 108. The barrier layer 106 may include titanium, titanium nitride, titanium oxide, tantalum, tantalum nitride, tantalum oxide, the like, or a combination thereof. The barrier layer 106 may be formed by, for example, an atomic layer deposition (ALD) process.

Then, the wire 108 is formed in the remaining portion of the trench. The wire 108 may be formed by, for example, a physical vapor deposition (PVD) process. The wire 108 may include copper or polycrystalline silicon, in accordance with some embodiments.

A protective layer 110 is then formed over the dielectric layer 104 and the wire 108 to prevent the wire 108 from being damaged or oxidized by subsequent processes. The protective layer 110 may include silicon nitride and may be formed by using any suitable deposition process, such as a CVD process.

Figure 1B:
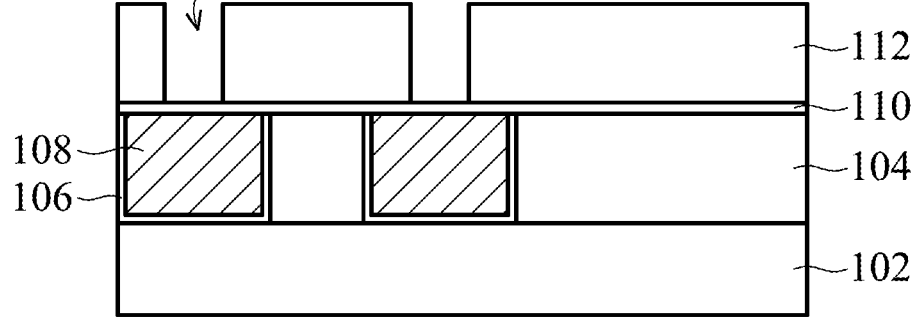

Then, as illustrated in FIG. 1B, a dielectric layer 112 is formed over the dielectric layer 104 and the protective layer 110. The material and formation method of the dielectric layer 112 may be selected from the material and formation method of the dielectric layer 104. The dielectric layer 112 may then be etched by an etching process with one or more mask layers (not shown) to form a through hole 114 passing through the dielectric layer 112, wherein the through hole 114 exposes the protective layer 110 and does not expose the wire 108 to prevent the wire 108 from being damaged or oxidized.

Figure 1C:
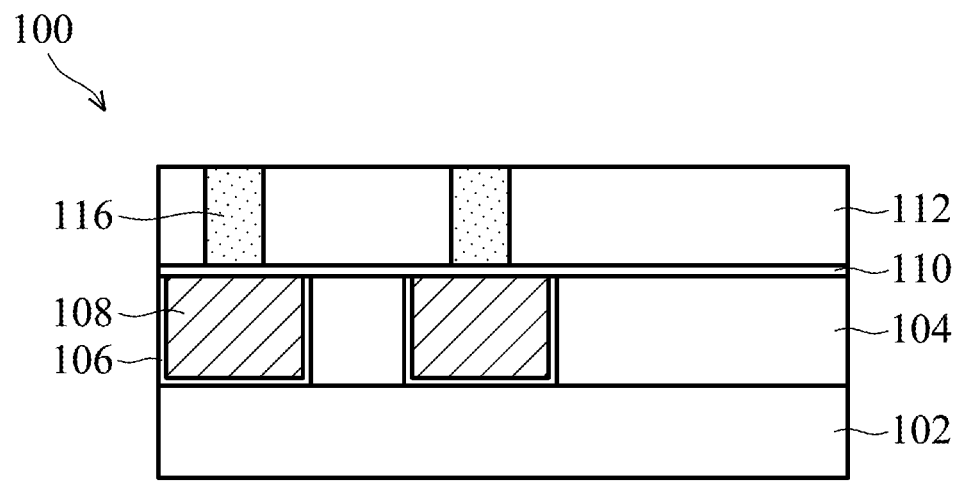

Then, as illustrated in FIG. 1C, a dummy contact 116 is formed in the through hole 114, and the dummy contact 116 is located directly above the protective layer 110. In accordance with some embodiments, the dummy contact 116 may include a photoresist material, spin-on carbon, spin-on glass, spin-on-hard mask (SOH) material, an organic planarization layer (OPL) material, an amorphous carbon film material, an anti-reflection film material, the like, or a combination thereof. The dummy contact 116 may be formed by using any suitable process, such as a spin coating process, or the like.

Figure 1D:
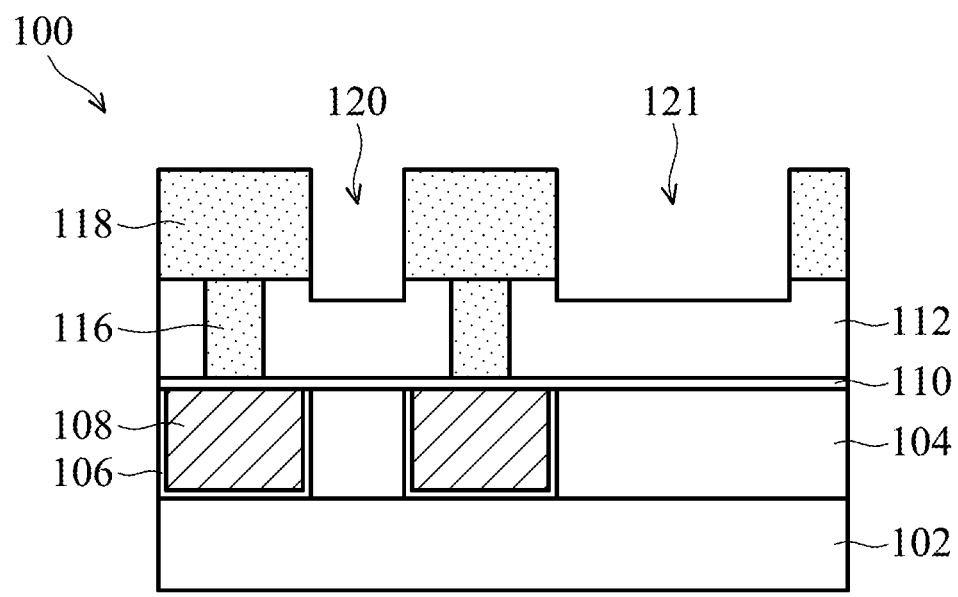

Then, as illustrated in FIG. 1D, a dummy wire 118 is formed over the dielectric layer 112, wherein the width of the dummy wire 118 is greater than the width of the dummy contact 116. The dummy contact 116 and the dummy wire 118 are removed by subsequent processes and replaced with physically functional contacts and wires. In accordance with some embodiments, a dummy wiring material may be deposited over the dielectric layer 112, and then the dummy wiring material may be etched by an etching process with one or more mask layers (not shown) to form the dummy wire 118 and trenches 120 and 121 between the dummy wires 118. The dummy wiring material may be formed by using any suitable process, such as a plasma enhanced chemical vapor deposition (PECVD) process. In some embodiments, the dummy wire 118 may include polycrystalline silicon, polycrystalline germanium, polycrystalline silicon-germanium, the like, or a combination thereof.

Although the dummy contact 116 and the dummy wire 118 include different materials in the embodiments described herein to have better uniformity and reduce the formation of voids, the present disclosure is not limited thereto. In other embodiments, the dummy contact 116 and the dummy wire 118 may include the same material to reduce cost.

As illustrated in FIG. 1D, the trenches 120 and 121 formed by etching may extend into the dielectric layer 112 such that the bottom surfaces of the trenches 120, 121 may be lower than the bottom surface of the dummy wire 118. For example, the bottom surface of the trench 120 and the bottom surface of the trench 121 may be substantially aligned with the bottom surface of the dummy wire 118. Further, the bottom surface of the trench 120 may be substantially aligned with the bottom surface of the trench 121, but the bottom surface of the trench 120 may also be higher or lower than the bottom surface of the trench 121. The aspect ratios and the positions of the bottom surfaces of the trenches 120 and 121 may be controlled by etching in order to form a gap in the desired position or even with the desired line width, thereby determining whether an air gap is formed and the position and the size of the air gap. For example, when the aspect ratio of the trench is within a range in which an air gap can be formed, a trench with a higher aspect ratio can form a larger air gap therein.

Figure 1E:
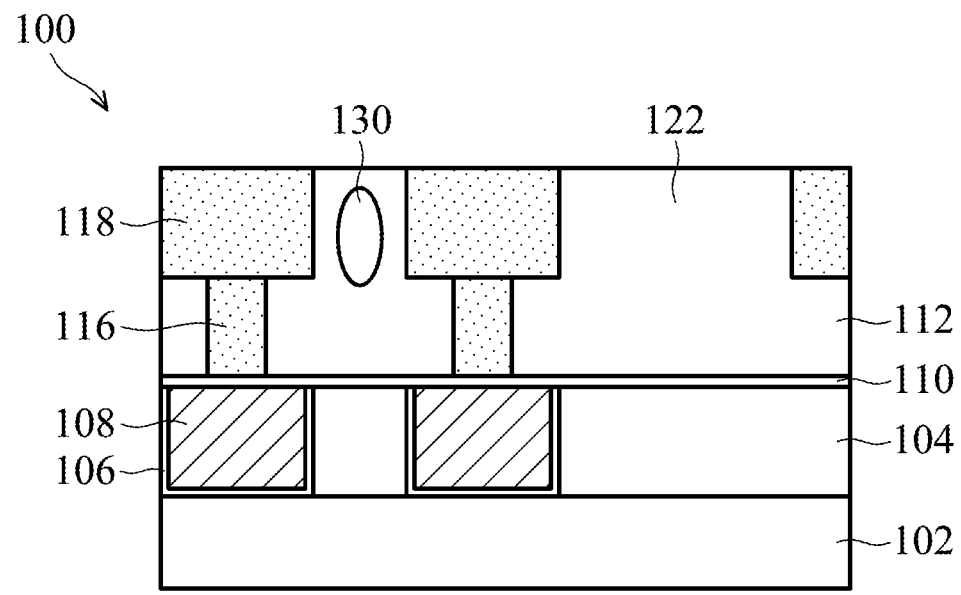

Then, as illustrated in FIG. 1E, the dielectric layer 122 is filled in the trenches 120 and 121, and then the dielectric layer 122 is planarized. The material and formation method of the dielectric layer 122 may be selected from the material and formation method of the dielectric layer 104, and other suitable material and formation method may also be used. Moreover, although an interface between the dielectric layers 112 and 122 is not illustrated in FIG. 1E, in the embodiments where the dielectric layers 112 and 122 include different materials, the interface may exist between the dielectric layers 112 and 122.

Referring to FIGS. 1D and 1E, an air gap 130 is formed in the trench 120 having a higher aspect ratio, and an air gap is not formed in the trench 121 having a lower aspect ratio. The aspect ratios of the trenches 120 and 121 may be adjusted such that both of the trenches 120 and 121 have an air gap. In accordance with some embodiments, the trench used to form an air gap therein has an aspect ratio higher than about 2.5, such as higher than about 2.55, or higher than about 3.2. For example, a trench having a width of about 120 nanometers (nm) and a depth of about 386 nm may form an air gap therein and the air gap has a height of about 201 nm and a width of about 87 nm.

It is worth mentioning that, by the manufacturing method of the present disclosure, the bottom surface of the trench 120 may be lower than the bottom surface of the dummy wire 118, and thus the bottom surface of the air gap 130 may be lower than the bottom surface of the dummy wire 118. In particular, the present disclosure can adjust the position of the bottom surface of the trench 120 to form the air gap 130 in the desired location. In addition, the size of the air gap 130 can be adjusted by controlling the depth and the width of the trench 120, for example, within the range of an aspect ratio in which an air gap can be formed, a higher aspect ratio can form a larger air gap. Therefore, the present disclosure can easily control the position and the size of the air gap 130.

Figure 1F:
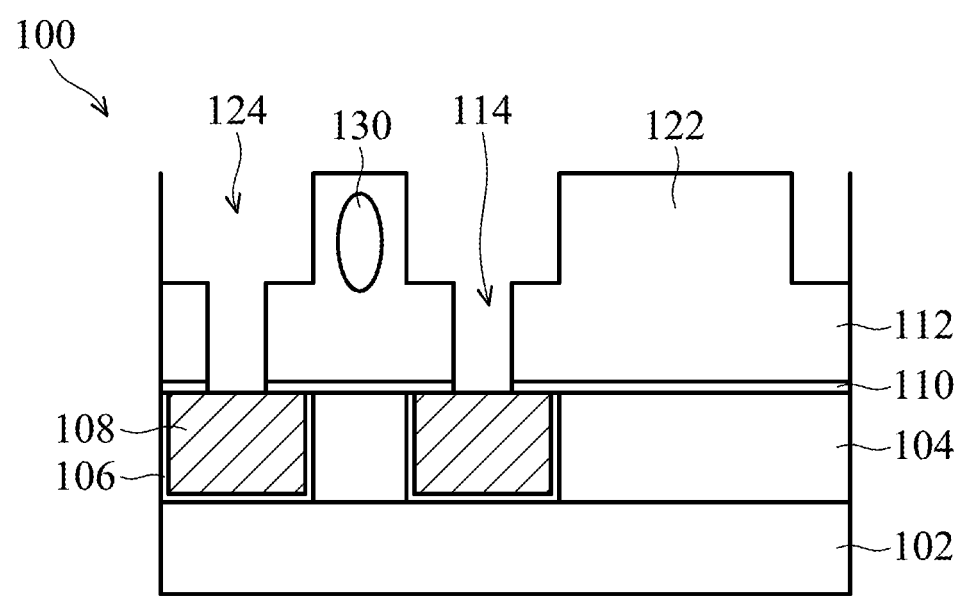

Then, as illustrated in FIG. 1F, the dummy contact 116 and the dummy wire 118 are removed to expose the through hole 114 again and form a wiring trench 124 over the through hole 114. The dummy contact 116 and the dummy wire 118 may be removed by using a dry etching process, a wet etching process, or a combination thereof. The etching process may remove the dummy contact 116 and the dummy wire 118, and substantially not etch the dielectric layers 112 and 122. Then, the protective layer 110 under the through hole 114 may be removed by an etching process, and followed by subsequent wire plating processes.

Figure 1G:
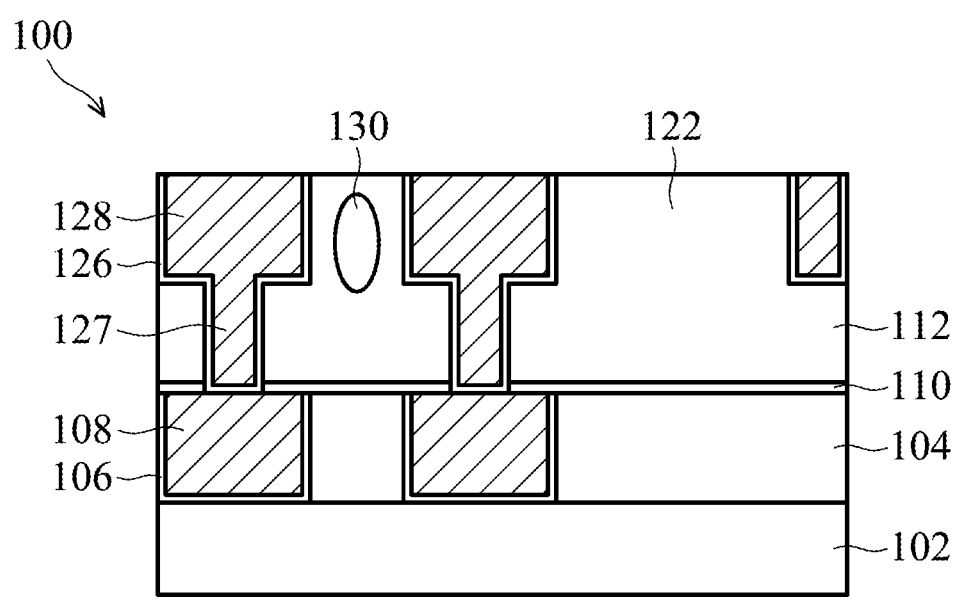

Then, as illustrated in FIG. 1G, a barrier layer 126 and a contact 127 and a wire 128 on the barrier layer 126 are formed in the through hole 114 and the wiring trenches 124. The material and formation method of the barrier layer 126 may be selected from the material and formation method of the barrier layer 106, the material and formation method of the contact 127 and the wire 128 may be selected from the material and formation method of the wire 108, but other suitable materials and formation methods may also be used. In accordance with some embodiments, the contact 127 and the wire 128 may be formed in one step by a dual damascene process. In other embodiments, the contact 127 and the wire 128 may be formed in different steps. After the wire 128 is formed, the wire 128 may be planarized by a planarization process, for example, a chemical mechanical polishing (CMP) process.

As illustrated in FIG. 1G, the bottom surface of the air gap 130 is lower than the bottom surface of the wire 128. Of course, the bottom surface of the air gap 130 may also be substantially aligned with or higher than the bottom surface of the wire 128 according to actual requirements. If the top surface of the air gap 130 is lower than the top surface of the wire 128, the air gap 130 may be prevented from being exposed after the planarization process of the wire 128, which may cause problems such as a short circuit or failure of the semiconductor device 100. For example, the top surface of the air gap 130 may be about 30 nm to about 50 nm, such as about 40 nm, below the top surface of the wire 128.

In the above embodiment, the present disclosure provides a method of manufacturing the semiconductor device 100 having an air gap 130. The method includes forming the dummy contact 116 and the dummy wire 118, and then forming the dielectric layer 122 with the air gap 130 formed between the dummy wires 118, followed by the dummy contact 116 and the dummy wire 118 are removed, and the contact 127 and the wire 128 are formed. In other words, the method provided by the present disclosure is to form the dielectric layer 122 and then form the wire 128. As compared with the method of forming the wire 128 and then forming the dielectric layer 122, the method provided by the present disclosure can prevent the wire 128 from being damaged by the process of forming the dielectric layer 122, thereby improving the reliability of the semiconductor device 100.

Furthermore, since there is no need to worry about the wire 128 being damaged, it is easier to etch the trench to have the desired shape. For example, the position of the bottom surface and the aspect ratio of the trench 120 in which the air gap 130 is formed are adjusted to control the position and the size of the air gap 130, thereby adjusting the semiconductor device 100 to have the desired dielectric constant.

In addition, the method provided by the present disclosure can directly form the dielectric layer 122 having the air gap 130. As compared with the method of etching a formed dielectric layer and then re-forming a dielectric layer having the air gap, the method provided by the present disclosure can reduce the number of mask layers used and the manufacturing steps, and also can make the air gap 130 self-aligned between the wires 128.

Figure 2A:
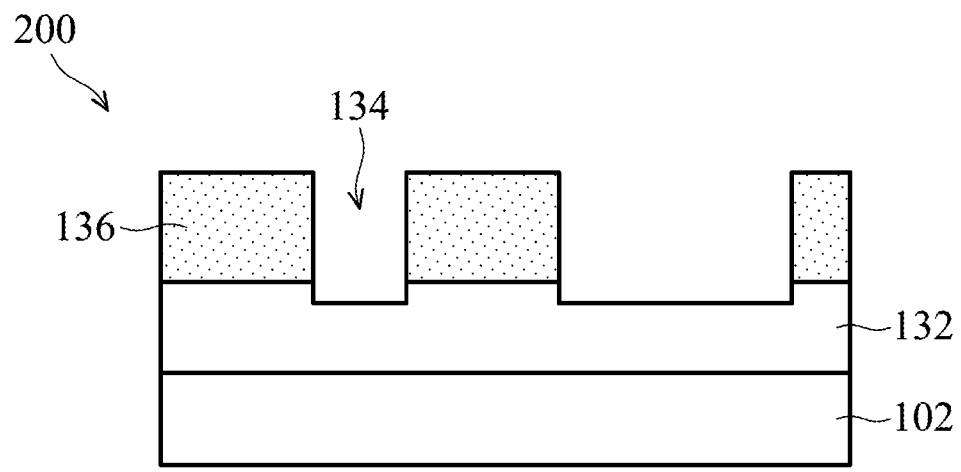
FIGS. 2A-2C are cross-sectional views illustrating various stages of manufacturing a semiconductor device in accordance with another embodiments.
Figure 2B:
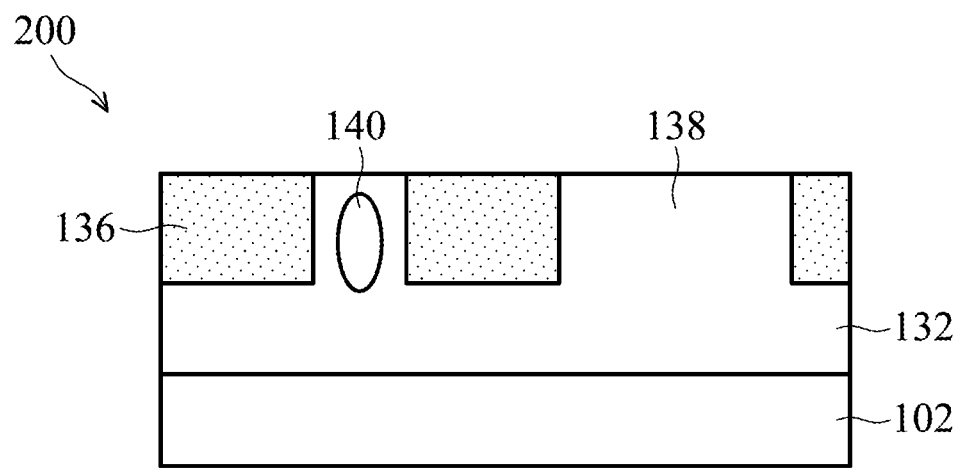
Figure 2C:
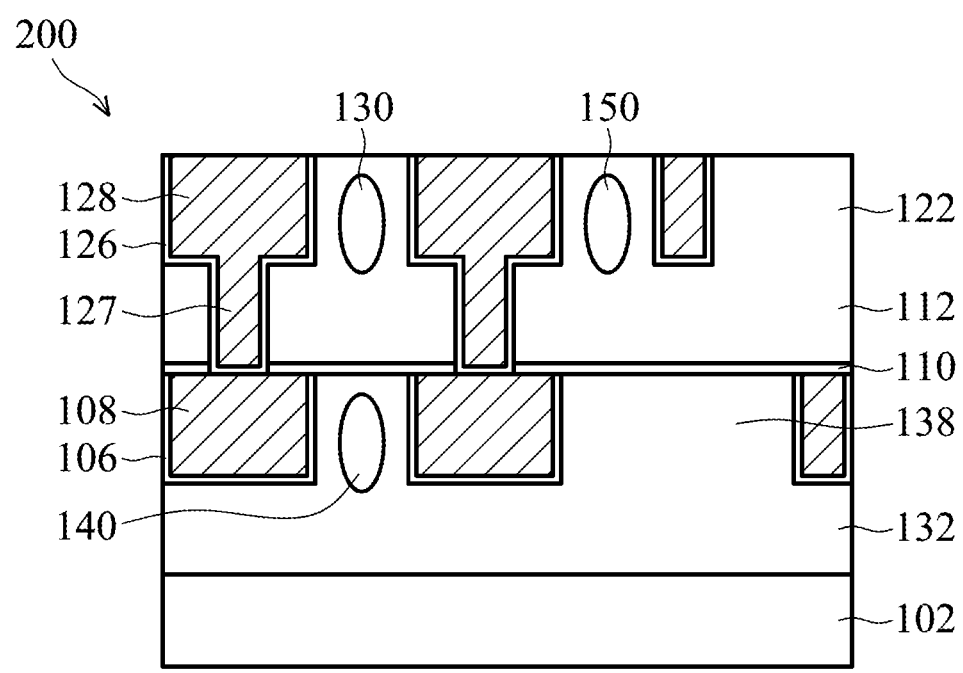

Referring to FIGS. 2A-2C, in contrast to the embodiments of FIGS. 1A-1G, the following embodiments do not form dummy contacts, and only trenches are formed by using dummy wires. For example, an air gap may be formed between the lower wires 108 to adjust the dielectric constant between the wires 108.

As illustrated in FIG. 2A, a dielectric layer 132 is formed over the substrate 102, and a dummy wire 136 is formed over the dielectric layer 132. The material and formation method of the dielectric layer 132 may be selected from the material and formation method of the dielectric layer 104, and the material and formation method of the dummy wire 136 may be selected from the material and formation method of the dummy wire 118.

Then, the dummy wire 136 may be etched by an etching process with one or more mask layers (not shown) to form a trench 134. In FIG. 2A, the trench 134 passes through the dummy wire 136, and the bottom surface of the trench 134 is lower than the bottom surface of the dummy wire 136, but the present disclosure is not limited thereto. The position of the bottom surface and the aspect ratio of the trench 134 may be adjusted to adjust the position and the size of the subsequently formed air gap.

Then, as illustrated in FIG. 2B, a dielectric layer 138 may be filled between the dummy wires 136, and the dielectric layer 138 may be planarized by a CMP process, in accordance with some embodiments. The material and formation method of the dielectric layer 138 may be selected from the material and formation method of the dielectric layer 132, but other suitable material and formation method may also be used.

Then, as illustrated in FIG. 2C, the dummy wire 136 is removed to form a wiring trench, and the barrier layer 106 and the wire 108 are formed in the wiring trench, in accordance with some embodiments. The protective layer 110, the dielectric layers 112, 122, the barrier layer 126, the contact 127, the wire 128, and the air gap 130 may then be formed over the wire 108 and the dielectric layer 138, wherein the wire 108 is located directly below the contact 127 and the wire 128, with reference to FIGS. 1A-1G and the above-mentioned method. Additionally, the aspect ratio of the trench between the wires 128 may be adjusted to form an additional air gap 150.

In the above embodiments, the air gaps 130, 140, and 150 are formed in the dielectric layer 138 between the wires 108 and formed in the dielectric layer 122 between the wires 128 to adjust the semiconductor device 200 to have the desired dielectric constant, thereby reducing the problem caused by RC delay, and improving the performance of the semiconductor device 200.

In summary, the present disclosure provides a method of forming an air gap in an interconnect structure. The method includes forming a dummy contact and/or a dummy wire, and then forming a dielectric layer having an air gap between the dummy wires. The dummy contact and/or the dummy wire are then removed and the contact and/or the wire are formed. Since the method provided by the present disclosure is to form a dielectric layer and then form a wire, as compared with the method of forming a wire and then forming a dielectric layer, the method provided by the present disclosure can prevent the wire from being damaged by the process of forming the dielectric layer, and can improve reliability of the semiconductor device.

Furthermore, since there is no need to worry about the wire being damage, it is easier to etch a trench to have the desired shape. For example, the position of the bottom surface and the aspect ratio of the trench are controlled to form an air gap in the desired position in the trench and having the desired size, to adjust the semiconductor device to have the desired dielectric constant.

In addition, since the method provided by the present disclosure directly forms a dielectric layer having an air gap, as compared with the method of etching a formed dielectric layer and then re-forming a dielectric layer having the air gap, the method provided by the present disclosure can reduce the number of mask layers used and the manufacturing steps, and also can make the air gap self-aligned between the wires, thereby reducing the cost and improving the yield of the semiconductor device.

Although the present disclosure has been described above by various embodiments, these embodiments are not intended to limit the disclosure. Those skilled in the art should appreciate that they may make various changes, substitutions and alterations on the basis of the embodiments of the present disclosure to realize the same purposes and/or advantages as the various embodiments described herein. Those skilled in the art should also appreciate that the present disclosure may be practiced without departing from the spirit and scope of the disclosure. Therefore, the scope of protection of the present disclosure is defined as the subject matter set forth in the appended claims.

What is claimed is:

1. A method of manufacturing semiconductor devices, comprising:
   forming a first dielectric layer and a through hole passing through the first dielectric layer over a substrate;
   forming a plurality of dummy contacts in the through hole;

forming a plurality of first dummy wires on the plurality of dummy contacts;

filling a second dielectric layer between the plurality of first dummy wires, wherein the second dielectric layer has a first air gap;

after filling the second dielectric layer, removing the dummy contacts and the first dummy wires to expose the through hole, thereby forming a first wiring trench over the through hole; and forming a contact and a first wire in the through hole and the first wiring trench.

2. The method as claimed in claim 1, wherein a width of each of the first dummy wires is greater than a width of each of the dummy contacts.

3. The method as claimed in claim 1, wherein forming the first dummy wires comprises:

depositing a first dummy wiring material over the first dielectric layer; and etching the first dummy wiring material to form the plurality of first dummy wires and a plurality of trenches between the plurality of first dummy wires.

4. The method as claimed in claim 3, wherein the plurality of trenches extends into the first dielectric layer.

5. The method as claimed in claim 1, wherein a top surface of the first air gap is lower than a top surface of the first wire.

6. The method as claimed in claim 1, wherein a bottom surface of the first air gap is lower than a bottom surface of the first wire.

7. The method as claimed in claim 1, wherein the plurality of dummy contacts comprises a photoresist material, spin-on carbon, spin-on glass, spin-on-hard mask (SOH) material, an organic planarization layer (OPL) material, an amorphous carbon film material, an anti-reflection film material, or a combination thereof.

8. The method as claimed in claim 1, wherein the plurality of first dummy wires comprises polycrystalline silicon, polycrystalline germanium, polycrystalline silicon-germanium, or a combination thereof.

9. The method as claimed in claim 1, wherein a wet etching process is used to remove the dummy contacts and the first dummy wires.

10. The method as claimed in claim 1, further comprising conformally forming a first barrier layer in the through hole and the first wiring trench.

11. The method as claimed in claim 10, wherein the first barrier layer comprises titanium, titanium nitride, titanium oxide, tantalum, tantalum nitride, tantalum oxide, or a combination thereof.

12. The method as claimed in claim 1, further comprising:

forming a third dielectric layer over the substrate before forming the first dielectric layer; and forming a second wire in the third dielectric layer, wherein the second wire is directly below the contact.

13. The method as claimed in claim 12, wherein forming the second wire comprises:

forming a second dummy wire over the substrate;

filling the third dielectric layer between the second dummy wire;

removing the second dummy wire to form a second wiring trench; and forming the second wire in the second wiring trench.

14. The method as claimed in claim 12, wherein the third dielectric layer has a second air gap.

15. The method as claimed in claim 14, wherein a bottom surface of the second air gap is lower than a bottom surface of the second wire.

16. The method as claimed in claim 12, further comprising:

forming a protection layer covering a top surface of the second wire before forming the first dielectric layer; and removing the protection layer under the through hole after removing the dummy contacts and the first dummy wires.

17. The method as claimed in claim 16, wherein the protection layer comprises silicon nitride.

18. The method as claimed in claim 1, wherein the second dielectric layer between the plurality of first dummy wires is in contact with the first dielectric layer.

19. The method as claimed in claim 1, wherein the second dielectric layer is in contact with the plurality of first dummy wires, and the second dielectric layer and the plurality of dummy contacts are spaced apart by the first dielectric layer.

* * * * *